(12) United States Patent
Sung et al.

(10) Patent No.: US 10,354,935 B2
(45) Date of Patent: Jul. 16, 2019

(54) GRAPHENE STRUCTURE AND METHOD FOR MANUFACTURING THE SAME

(71) Applicant: IUCF-HYU (INDUSTRY-UNIVERSITY COOPERATION FOUNDATION HANYANG UNIVERSITY), Seoul (KR)

(72) Inventors: Myungmo Sung, Seoul (KR); Sejoon Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 15/317,450

(22) PCT Filed: Jun. 9, 2015

(86) PCT No.: PCT/KR2015/005790
§ 371 (c)(1),
(2) Date: Dec. 9, 2016

(87) PCT Pub. No.: WO2015/190807
PCT Pub. Date: Dec. 17, 2015

(65) Prior Publication Data
US 2017/0125320 A1    May 4, 2017

(30) Foreign Application Priority Data

Jun. 10, 2014 (KR) ........................ 10-2014-0070293

(51) Int. Cl.
*B82Y 30/00*     (2011.01)
*B82Y 40/00*     (2011.01)
(Continued)

(52) U.S. Cl.
CPC ........ *H01L 23/3171* (2013.01); *C01B 32/186* (2017.08); *C01B 32/194* (2017.08);
(Continued)

(58) Field of Classification Search
CPC . H01L 29/1606; H01L 23/3171; H01L 29/32; H01L 21/02595; H01L 21/7806;
(Continued)

(56) References Cited

U.S. PATENT DOCUMENTS

2011/0129675 A1* 6/2011 Choi ............... H01L 31/035227
                                                    428/408
2012/0021224 A1* 1/2012 Everett ............. H01L 21/02491
                                                    428/408
(Continued)

FOREIGN PATENT DOCUMENTS

KR    10-2013-0089041 A    8/2013
KR    10-2013-0124702 A    11/2013
(Continued)

OTHER PUBLICATIONS

Baeck et al., Growth of Pt Nanowires by Atomic Layer Deposition on highly Ordered Pyrolitic Graphite, Jan. 14, 2013, Nano Letter ACS Publications, Nano. Lett. 2013, 13, 457-463.*
(Continued)

*Primary Examiner* — Nduka E Ojeh
(74) *Attorney, Agent, or Firm* — Sughrue Mion, PLLC

(57) ABSTRACT

A graphene structure is provided. The graphene structure includes a two-dimensional base graphene layer having a defect, and a linking material provided at the defect of the base graphene layer.

18 Claims, 14 Drawing Sheets

(a)

(b)

(51) Int. Cl.
| | |
|---|---|
| *H01L 21/02* | (2006.01) |
| *H01L 21/78* | (2006.01) |
| *H01L 23/31* | (2006.01) |
| *H01L 29/04* | (2006.01) |
| *H01L 29/16* | (2006.01) |
| *H01L 29/32* | (2006.01) |
| *C01B 32/186* | (2017.01) |
| *C01B 32/194* | (2017.01) |
| *H01L 29/06* | (2006.01) |
| *H01L 29/08* | (2006.01) |
| *H01L 31/00* | (2006.01) |

(52) U.S. Cl.
CPC .... *H01L 21/0228* (2013.01); *H01L 21/02527* (2013.01); *H01L 21/02595* (2013.01); *H01L 21/7806* (2013.01); *H01L 29/04* (2013.01); *H01L 29/1606* (2013.01); *H01L 29/32* (2013.01); *B82Y 30/00* (2013.01); *B82Y 40/00* (2013.01); *C01B 2204/22* (2013.01); *Y10S 977/734* (2013.01); *Y10S 977/843* (2013.01); *Y10S 977/847* (2013.01); *Y10S 977/932* (2013.01)

(58) Field of Classification Search
CPC .......... H01L 21/02527; H01L 21/0228; H01L 29/04; H01L 29/66015; Y10S 977/847; Y10S 977/734
USPC ...................................... 257/27, 29; 438/105
See application file for complete search history.

(56) References Cited

U.S. PATENT DOCUMENTS

| | | | |
|---|---|---|---|
| 2012/0241069 A1* | 9/2012 | Hofmann | B82Y 30/00 156/60 |
| 2013/0017323 A1* | 1/2013 | Garces | C23C 16/02 427/126.4 |
| 2013/0071564 A1 | 3/2013 | Miller | |
| 2013/0108839 A1* | 5/2013 | Arnold | B82Y 30/00 428/195.1 |
| 2013/0161252 A1* | 6/2013 | Chrupalla | B01D 25/26 210/411 |
| 2013/0273261 A1 | 10/2013 | Gardner et al. | |
| 2013/0292161 A1* | 11/2013 | Liu | C25D 5/022 174/257 |
| 2014/0374960 A1* | 12/2014 | Cojocaru | C01B 32/184 264/430 |
| 2015/0235959 A1* | 8/2015 | Lee | H01L 23/53276 257/762 |
| 2016/0284811 A1* | 9/2016 | Yu | H01L 29/454 |

FOREIGN PATENT DOCUMENTS

| | | |
|---|---|---|
| KR | 10-2013-0142794 A | 12/2013 |
| KR | 10-2014-0037518 A | 3/2014 |

OTHER PUBLICATIONS

Han-Bo-Ram Lee, et al., "Growth of Pt Nanowires by Atomic Layer Deposition on Highly Ordered Pyrolytic Graphite", Nano Letters, Jan. 14, 2013, pp. 457-463, vol. 13.
International Search Report of PCT/KR2015/005790, dated Sep. 16, 2015. [PCT/ISA/210].

* cited by examiner

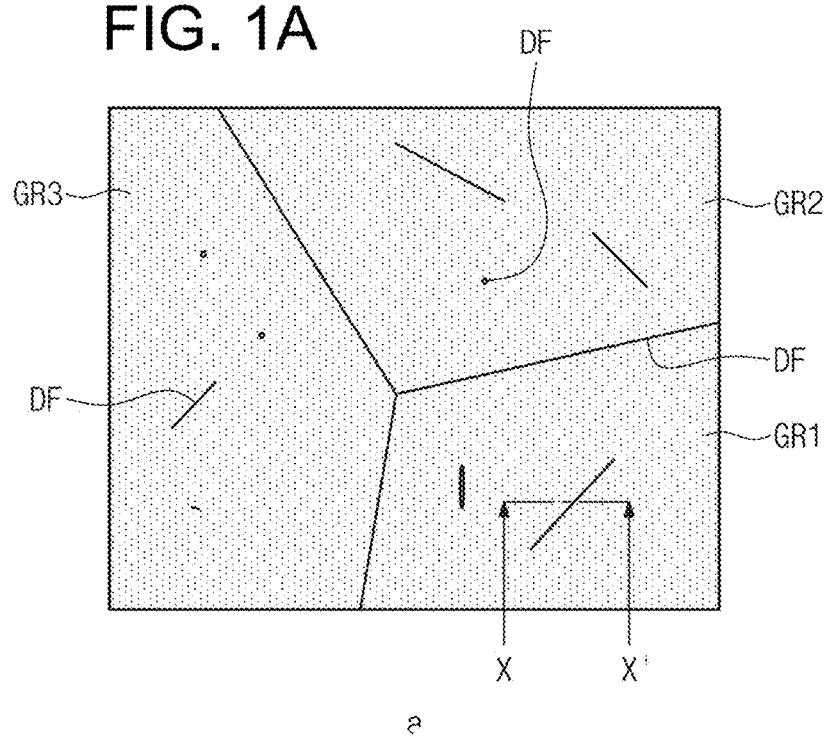
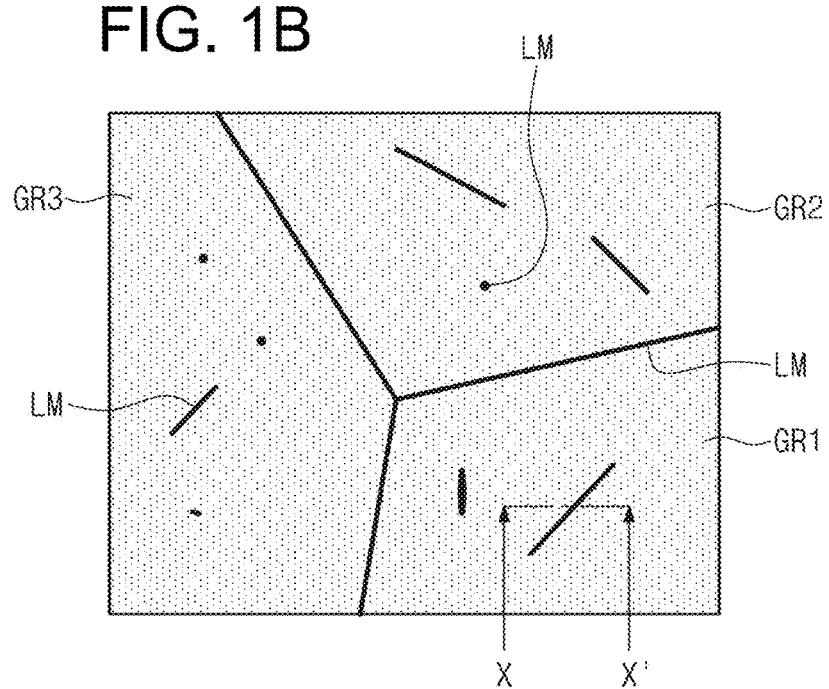

FIG. 2A
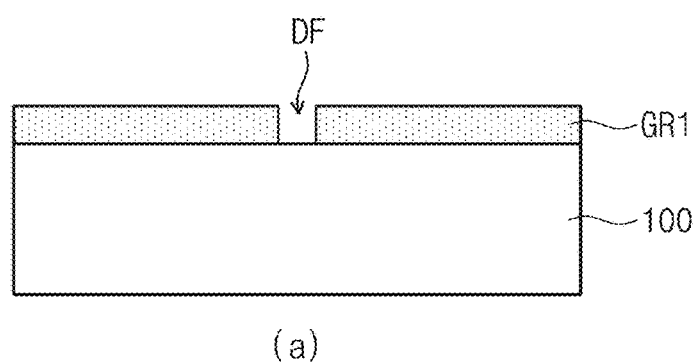
(a)
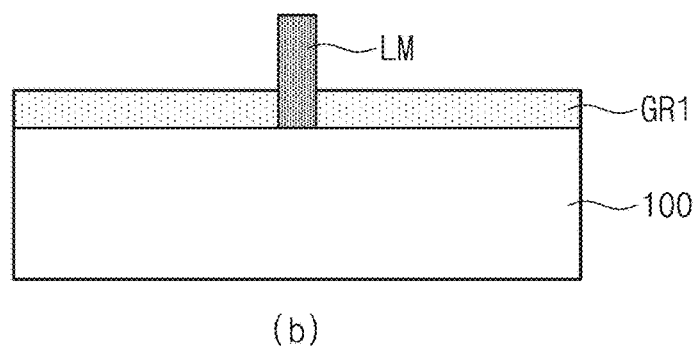
(b)

FIG. 2B
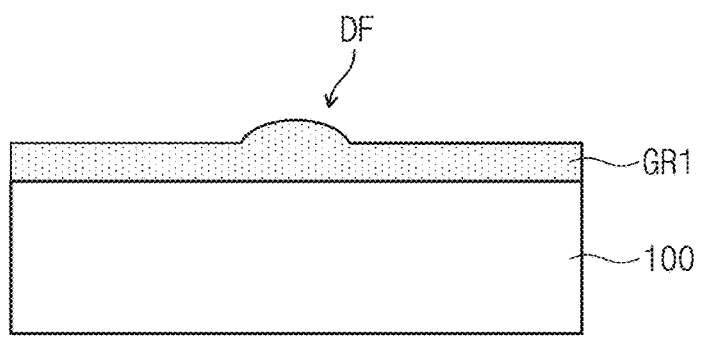
(a)
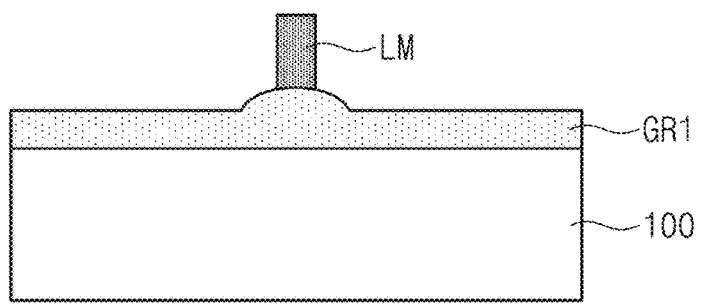
(b)

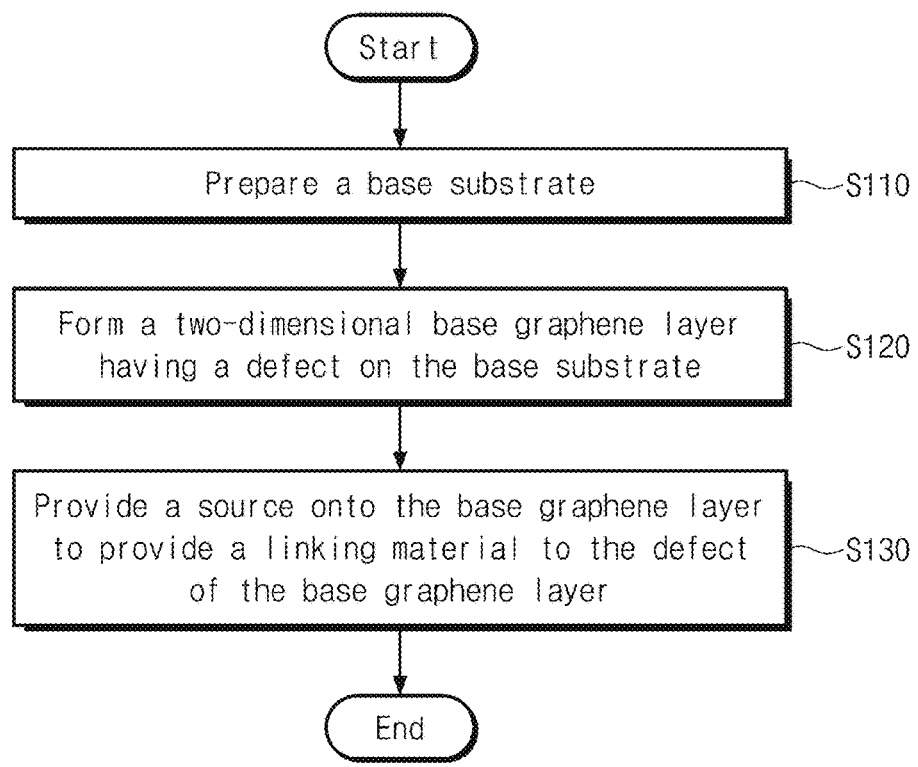

GRAPHENE STRUCTURE AND METHOD FOR MANUFACTURING THE SAME

CROSS-REFERENCE TO RELATED APPLICATION

This application is a National Stage of International Application No. PCT/KR2015/005790 filed Jun. 9, 2015, claiming priority based on Korean Patent Application No. 10-2014-0070293 filed Jun. 10, 2014, the contents of all of which are incorporated herein by reference in their entirety.

BACKGROUND

1. Field

Embodiments of the inventive concepts relate to a graphene structure and a method for manufacturing the same and, more particularly, to a graphene structure including a linking material provided at a defect of a base graphene layer and a method for manufacturing the same.

2. Description of the Related Art

A graphene is structurally and chemically very stable and has excellent electrical characteristics by its quantum mechanical property. Electrons moving in the graphene may be about 100 times faster than electrons moving in single-crystalline silicon, and the amount of a current flowing through the graphene may be about 100 times more than the amount of a current flowing through copper. Due to these characteristics, the graphene is spotlighted as the next-generation material that will be substituted for a conventional material.

Generally, the graphene manufactured to have a large area may be formed in a poly-crystalline state. In this case, electrical characteristics of the graphene are determined by shapes of a grain and a grain boundary and the numbers of grains and grain boundaries. Thus, Korean Patent Publication No. 10-2013-0089041 (Application No. 10-2012-0010384) discloses a method for forming a graphene layer from a graphene seed layer in one direction in order to form a single-crystalline graphene layer not including a grain boundary.

However, process conditions for manufacturing the single-crystalline graphene layer may be stringent, and a manufacturing yield of the single-crystalline layer may be low. Thus, it is required to research and develop methods capable of improving characteristics of a poly-crystalline graphene layer.

SUMMARY

Embodiments of the inventive concepts may provide a highly reliable graphene structure and a method for manufacturing the same.

Embodiments of the inventive concepts may also provide a graphene structure having a high conductivity and a method for manufacturing the same.

Embodiments of the inventive concepts may also provide a graphene structure having an excellent mechanical characteristic and a method for manufacturing the same.

Embodiments of the inventive concepts may also provide a graphene structure having a high thermal conductivity and a method for manufacturing the same.

Embodiments of the inventive concepts may also provide a graphene structure having a very low vapor transmission rate and a method for manufacturing the same.

Embodiments of the inventive concepts may also provide a graphene structure having a high optical transmittance and a high flexibility and a method for manufacturing the same.

Embodiments of the inventive concepts may also provide a graphene structure, characteristics of which are improved as compared with those of a poly-crystalline graphene, and a method for manufacturing the same.

Embodiments of the inventive concepts may also provide a graphene structure in which a linking material is selectively provided at a defect of a base graphene layer, and a method for manufacturing the same.

In an aspect, a graphene structure may include a base graphene layer having a defect, and a linking material provided at the defect of the base graphene layer.

In some embodiments, the linking material may be combined with carbon of the base graphene layer adjacent to the defect.

In some embodiments, the linking material may be selectively provided to the defect of the base graphene layer.

In some embodiments, the defect of the base graphene layer may include at least one of a grain boundary, a point defect, a line defect, or a $sp^3$ hybridization type defect.

In some embodiments, the base graphene layer may be in a poly-crystalline state.

In some embodiments, carbon of the base graphene layer adjacent to the defect may have a dangling bond, and the linking material may passivate the dangling bond.

In some embodiments, the graphene structure may include a first portion formed of the base graphene layer and having a first thickness, and a second portion formed of the linking material and having a second thickness greater than the first thickness.

In some embodiments, carbons of the base graphene layer adjacent to the defect may be connected to each other by the linking material.

In some embodiments, the graphene structure may have a higher mobility, a higher thermal conductivity, and a lower vapor transmission rate than a poly-crystalline two-dimensional (2D) graphene layer.

In some embodiments, the graphene structure may have a higher hardness than a poly-crystalline two-dimensional (2D) graphene layer.

In some embodiments, hole and electron mobilities of the graphene structure may be more homogeneous than hole and electron mobilities of a poly-crystalline two-dimensional (2D) graphene layer.

In some embodiments, the base graphene layer may include a plurality of the defects, a plurality of the linking materials may be provided at the plurality of defects, and the plurality of linking materials may be formed of the same material.

In an aspect, a method for manufacturing a graphene structure may include preparing a base substrate, forming a two-dimensional (2D) base graphene layer having a defect on the base substrate, and providing a linking material to the defect of the base graphene layer by providing a source onto the base graphene layer.

In some embodiments, the providing of the linking material may be performed by an atomic layer deposition (ALD) method.

In some embodiments, a sheet resistance and a mobility of the graphene structure may be adjusted according to a process temperature of the ALD method.

In some embodiments, a process temperature of the ALD method may be equal to or lower than 180 degrees Celsius.

In some embodiments, the providing of the source onto the base graphene layer may be performed a plurality of times, and a resistance of the graphene structure may be adjusted according to the number of times of the providing of the source onto the base graphene layer.

In some embodiments, the linking material may be selectively provided to the defect of the base graphene layer.

In some embodiments, the method may further include transferring the base graphene layer onto another substrate before the providing of the source onto the base graphene layer.

In some embodiments, the method may further include transferring the base graphene layer and the linking material onto another substrate after the providing of the linking material to the defect of the base graphene layer.

BRIEF DESCRIPTION OF THE DRAWINGS

FIGS. 1A and 1B are views illustrating a graphene structure and a method for manufacturing the same, according to example embodiments of the inventive concepts.

FIG. 2A is a view illustrating an embodiment of cross-sectional views taken along lines X-X' of FIG. 1.

FIG. 2B is a view illustrating another embodiment of cross-sectional views taken along lines X-X' of FIG. 1.

FIG. 4 is a flow chart illustrating a method for manufacturing a graphene structure, according to example embodiments of the inventive concepts.

DETAILED DESCRIPTION OF THE EMBODIMENTS

Figure 3A:
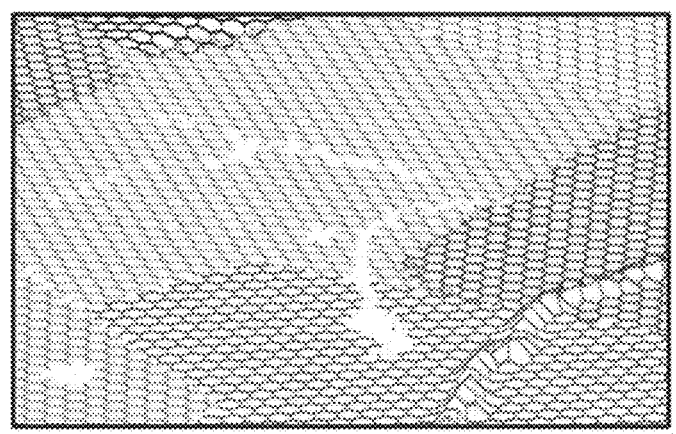
FIGS. 3A and 3B are mimetic views illustrating a graphene structure and a method for manufacturing the same, according to example embodiments of the inventive concepts.

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIGS. 1A and 1B are views illustrating a graphene structure and a method for manufacturing the same, according to example embodiments of the inventive concepts, FIG. 2A is a view illustrating an embodiment of cross-sectional views taken along lines X-X' of FIG. 1, FIG. 2B is a view illustrating another embodiment of cross-sectional views taken along lines X-X' of FIG. 1, and FIG. 3 is a mimetic view illustrating a graphene structure and a method for manufacturing the same, according to example embodiments of the inventive concepts.

Figure 3B:
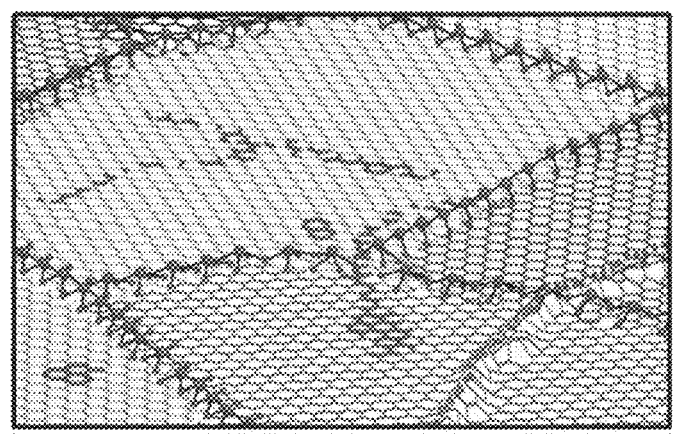

In detail, a view of FIG. 1A, a view (a) of FIG. 2A, a view (a) of FIG. 2B, and a view of FIG. 3A show base graphene layers having defects according to example embodiments of the inventive concepts. A view of FIG. 1B, a view (b) of FIG. 2A, a view (b) of FIG. 2B, and a view of FIG. 3B illustrate graphene structures in which linking materials are provided at the defects of the base graphene layers illustrated in the view of FIG. 1A, the view (a) of FIG. 2A, the view (a) of FIG. 2B, and the view of FIG. 3A, respectively.

Referring to FIGS. 1 to 3, a graphene structure according to example embodiments of the inventive concepts may include a base graphene layer GR1 to GR3 and a linking material LM.

The base graphene layer GR1 to GR3 may be a two-dimensional (2D) graphene layer. In some embodiments, the base graphene layer GR1 to GR3 may be formed by a chemical vapor deposition (CVD) method. Alternatively, the base graphene layer GR1 to GR3 according to example embodiments of the inventive concepts may be formed by another method. In other words, the formation method of the base graphene layer GR1 to GR3 is not limited to the CVD method.

In some embodiments, the base graphene layer GR1 to GR3 may be a poly-crystalline graphene layer. Alternatively, in other embodiments, the base graphene layer GR1 to GR3 may be a single-crystalline graphene layer.

The base graphene layer GR1 to GR3 may have a defect DF. In some embodiments, the defect DF of the base graphene layer GR1 to GR3 may be a point defect such as a vacancy existing in the base graphene layer GR1 to GR3. In other embodiments, the defect DF of the base graphene layer GR1 to GR3 may be a line defect existing in the base graphene layer GR1 to GR3.

In still other embodiments, the defect DF of the base graphene layer GR1 to GR3 may be a $sp^3$ hybridization type defect, as illustrated in the view (a) of FIG. 2B.

In yet other embodiments, the defect DF of the base graphene layer GR1 to GR3 may be a grain boundary that exists between a first graphene grain GR1 having a first crystal orientation and a second graphene grain GR2 having a second crystal orientation different from the first crystal orientation, between the first graphene grain GR1 and a third graphene grain GR3 having a third crystal orientation different from the first and second crystal orientations, and between the second graphene grain GR2 and the third graphene grain GR3.

The linking material LM may be provided at the defect DF of the base graphene layer GR1 to GR3. According to some embodiments of the inventive concepts, the linking material LM may be selectively provided to the defect DF of the base graphene layer GR1 to GR3. In other words, the linking material LM may be provided at the defect DF of the base graphene layer GR1 to GR3 but may not be provided at a portion of the base graphene layer GR1 to GR3 in which the defect DF does not exist.

When a plurality of defects DF exists in the base graphene layer GR1 to GR3, a plurality of the linking materials LM may be provided at the plurality of defects DF. In some embodiments, the plurality of linking materials LM may be formed of the same material. Alternatively, in other embodiments, the plurality of linking materials LM may be formed of different materials from each other.

The linking material LM may be combined with carbon of the base graphene layer GR1 to GR3 adjacent to the defect DF (e.g., carbon forming the defect DF). In other words, the carbon of the base graphene layer GR1 to GR3 adjacent to the defect DF may have a dangling bond, and the linking material LM may be combined with the dangling bond of the carbon adjacent to the defect DF. That is, the linking material LM may passivate the dangling bond of the base graphene layer GR1 to GR3. Thus, the linking material LM may connect carbon atoms (or carbon molecules), adjacent to the defect DF, to each other.

The linking material LM may be formed of a material that is easily combined with the dangling bond of the base graphene layer GR1 to GR3. In some embodiments, the linking material LM may be formed of a material having a hexagonal system similar to a structure of the base graphene layer GR1 to GR3. For example, the linking material LM may be formed of zinc oxide (ZnO) having a hexagonal wurtzite structure. Thus, characteristics of the graphene structure including the linking material LM provided at the defect DF of the base graphene layer GR1 to GR3 may be improved.

Alternatively, in other embodiments, the linking material LM may include at least one of ZnO, Al—ZnO, $Al_2O_3$, $TiO_2$, a $Al_2O_3$—$TiO_2$ nanolaminate, a ZnO—$TiO_2$ nanolaminate, NiS, TiS, $Sb_2S_3$, Zn—HQ, Zn-4MP, Zn—BDT, Al—HQ, Al-4MP, Al—BDT, Ti—HQ, Ti-4MP, or Ti—BDT. In still other embodiments, the linking material LM may be formed of an organic material.

A thickness of the linking material LM may be greater than a thickness of the base graphene layer GR1 to GR3. For example, when the thickness of the base graphene layer GR1 to GR3 is about 1 nm, the thickness of the linking material LM may be about 3 nm. Thus, the graphene structure according to example embodiments of the inventive concepts may include a first portion composed of the base graphene layer GR1 to GR3 and having a first thickness, and a second portion composed of the linking material LM and having a second thickness greater than the first thickness.

A hole mobility and an electron mobility of the graphene structure including the linking material LM provided at the defect DF of the base graphene layer GR1 to GR3 may be higher than a hole mobility and an electron mobility of a poly-crystalline 2D graphene layer. In other words, a hole mobility and an electron mobility of the base graphene layer GR1 to GR3 on which the linking material LM is formed may be higher than a hole mobility and an electron mobility of the base graphene layer GR1 to GR3 on which the linking material LM is not formed.

The hole mobility and the electron mobility of the graphene structure including the linking material LM provided at the defect DF of the base graphene layer GR1 to GR3 may be more homogeneous than a hole mobility and an electron mobility of a poly-crystalline 2D graphene layer. In other words, the hole mobility and the electron mobility of the base graphene layer GR1 to GR3 on which the linking material LM is formed may be more homogeneous than the hole mobility and the electron mobility of the base graphene layer GR1 to GR3 on which the linking material LM is not formed.

A hardness of the graphene structure including the linking material LM provided at the defect DF of the base graphene layer GR1 to GR3 may be higher than a hardness of a poly-crystalline 2D graphene layer. In other words, a hardness of the base graphene layer GR1 to GR3 on which the linking material LM is formed may be higher than a hardness of the base graphene layer GR1 to GR3 on which the linking material LM is not formed.

A thermal conductivity of the graphene structure including the linking material LM provided at the defect DF of the base graphene layer GR1 to GR3 may be higher than a thermal conductivity of a poly-crystalline 2D graphene layer. In other words, a thermal conductivity of the base graphene layer GR1 to GR3 on which the linking material LM is formed may be higher than a thermal conductivity of the base graphene layer GR1 to GR3 on which the linking material LM is not formed.

A vapor transmission rate of the graphene structure including the linking material LM provided at the defect DF of the base graphene layer GR1 to GR3 may be lower than a vapor transmission rate of a poly-crystalline 2D graphene layer. In other words, a vapor transmission rate of the base graphene layer GR1 to GR3 on which the linking material LM is formed may be lower than a vapor transmission rate of the base graphene layer GR1 to GR3 on which the linking material LM is not formed.

Even though the linking material LM is provided at the defect DF of the base graphene layer GR1 to GR3, an optical transmittance of the graphene structure may not be reduced. In other words, an optical transmittance of the base graphene layer GR1 to GR3 on which the linking material LM is formed may be substantially equal to an optical transmittance of the base graphene layer GR1 to GR3 on which the linking material LM is not formed.

Even though the linking material LM is provided at the defect DF of the base graphene layer GR1 to GR3, a flexibility of the graphene structure may not be reduced. Alternatively, the flexibility of the graphene structure including the linking material LM provided at the defect DF of the base graphene layer GR1 to GR3 may be higher than a flexibility of a poly-crystalline 2D graphene layer. In other words, a flexibility of the base graphene layer GR1 to GR3 on which the linking material LM is formed may be equal to or higher than a flexibility of the base graphene layer GR1 to GR3 on which the linking material LM is not formed.

Except for the electron and hole mobilities, the homogeneousness of the electron and hole mobilities, the hardness, the thermal conductivity, the vapor transmission rate, the optical transmittance, and the flexibility described above, other characteristics of the base graphene layer GR1 to GR3 having the linking material LM may be improved according to characteristics of the linking material LM as compared with those of the base graphene layer GR1 to GR3 on which the linking material LM is not formed.

The graphene structure according to example embodiments of the inventive concepts may include the base graphene layer GR1 to GR3 and the linking material LM provided at the defect DF of the base graphene layer GR1 to GR3. Thus, a highly reliable graphene structure having a high conductivity may be provided.

If the linking material LM is not provided at the defect DF of the base graphene layer GR1 to GR3 formed in the poly-crystalline state, electrical/mechanical/chemical characteristics of the base graphene layer GR1 to GR3 may be deteriorated by the defect DF including the grain boundary existing in the base graphene layer GR1 to GR3.

However, according to example embodiments of the inventive concepts as described above, the linking material LM may be provided at the defect DF of the base graphene layer GR1 to GR3. Thus, it is possible to provide the graphene structure of which the characteristics are improved as compared with those of a poly-crystalline graphene layer.

Hereinafter, a method for manufacturing a graphene structure according to example embodiments of the inventive concepts will be described in more detail.

FIG. 4 is a flow chart illustrating a method for manufacturing a graphene structure, according to example embodiments of the inventive concepts.

Referring to FIGS. 1 and 4, a base substrate 100 is prepared (S110). For example, the base substrate 100 may be a metal substrate, a semiconductor substrate, or a plastic substrate. The base substrate 100 may be flexible.

A base graphene layer GR1 to GR3 may be formed on the base substrate 100 (S120). The base graphene layer GR1 to GR3 may be two-dimensionally formed on a top surface of the base substrate 100 and may have the defect DF, as described with reference to FIGS. 1 to 3. In some embodiments, the base graphene layer GR1 to GR3 may be formed by a chemical vapor deposition (CVD) method.

A source may be provided onto the base graphene layer GR1 to GR3 to provide the linking material LM to the defect DF of the base graphene layer GR1 to GR3 (S130). To selectively provide the linking material LM to the defect DF, a process temperature and/or a process pressure for forming the linking material LM may be adjusted according to a kind of the used source.

To form the linking material LM, the operation of providing the source onto the base graphene layer GR1 to GR3 may be performed a plurality of times. In some embodiments, a resistance of the base graphene layer GR1 to GR3 on which the linking material LM is formed may be reduced depending on the number of times that the operation of providing the source onto the base graphene layer GR1 to GR3 is performed. In some embodiments, the plurality of the operations of providing the source onto the base graphene layer GR1 to GR3 may be performed using the same source to form the linking material LM.

In some embodiments, the operation of providing the linking material LM at the defect DF of the base graphene layer GR1 to GR3 may be performed by an atomic layer deposition (ALD) method. For example, the linking material LM may be formed using diethylzinc (DEZ) and deionized water ($H_2O$) by the ALD method. In this case, supplying diethylzinc (DEZ) and deionized water ($H_2O$) may include performing a unit process a plurality of times. The unit process may include providing diethylzinc (DEZ), performing a purge process using a purge gas, providing $H_2O$, and performing a purge process using a purge gas.

If the linking material LM is formed of zinc oxide by the ALD method at a temperature higher than 180 degrees Celsius, oxygen vacancies in the linking material LM formed of zinc oxide may be reduced to decrease midgap state defects. Thus, a carrier concentration of the linking material LM may be reduced to increase a sheet resistance of the graphene structure in which the linking material LM is provided at the defect DF of the base graphene layer GR1 to GR3. Therefore, according to example embodiments of the inventive concepts, the linking material LM may be formed at a process temperature of 180 degrees Celsius or less by the ALD method. In other words, a formation temperature of the linking material LM may be adjusted to adjust the carrier concentration of the linking material LM. As a result, the resistance value of the graphene structure may be adjusted.

Carbon adjacent to the defect DF of the base graphene layer GR1 to GR3 may have a dangling bond, and the dangling bond may provide a binding site. Thus, the source provided to form the linking material LM may selectively react with the carbon providing the binding site to selectively provide the linking material LM at the defect DF of the base graphene layer GR1 to GR3.

The base graphene layer GR1 to GR3 may be transferred to another substrate before or after the formation of the linking material LM. This will be described hereinafter with reference to FIGS. 5A and 5B and FIGS. 6A and 6B.

Figure 5A:
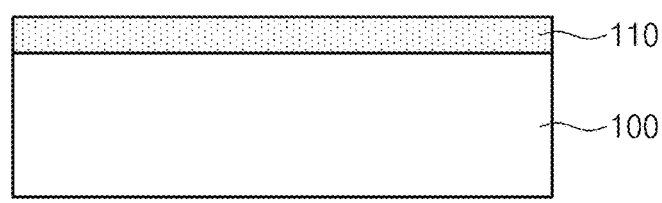
FIGS. 5A and 5B are views illustrating a modified example of a method for manufacturing a graphene structure according to example embodiments of the inventive concepts.
Figure 5B:
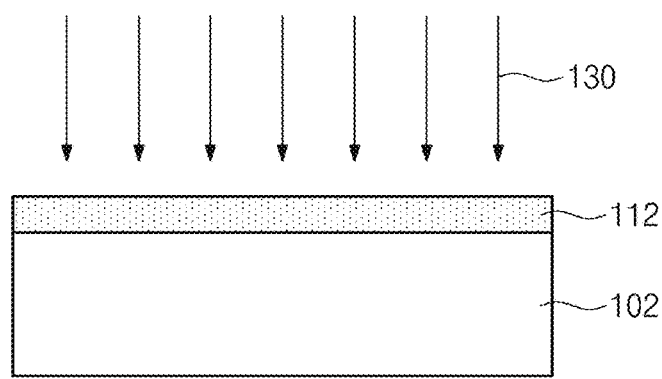

FIGS. 5A and 5B are views illustrating a modified example of a method for manufacturing a graphene structure according to example embodiments of the inventive concepts.

Referring to FIG. 5A, a base graphene layer 110 is formed on a base substrate 100. The base graphene layer 110 may have the defect DF, as described with reference to FIG. 1.

Referring to FIG. 5B, the base graphene layer 110 on the base substrate 100 may be transferred to another substrate 102 before the formation of the linking material described with reference to FIGS. 1 to 4. Transferring the base graphene layer 110 to the another substrate 102 may include forming a sacrificial layer (e.g., poly(methyl methacrylate) (PMMA)) on the base graphene layer 110, removing the base substrate 100 from the base graphene layer 110, disposing the base graphene layer 110 and the sacrificial layer on the another substrate 102, and removing the sacrificial layer. For example, when the sacrificial layer is formed of PMMA, the sacrificial layer may be removed using acetone.

After transferring the base graphene layer 110 to the another substrate 102, a source 130 may be provided to the base graphene layer 110 by the method described with reference to FIG. 4, thereby forming a graphene structure 112 in which the linking material is provided at the defect of the base graphene layer 110.

Figure 6A:
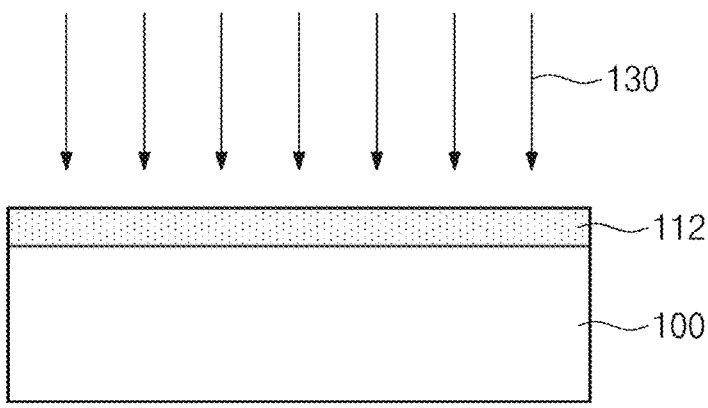
FIGS. 6A and 6B are views illustrating another modified example of a method for manufacturing a graphene structure according to example embodiments of the inventive concepts.
Figure 6B:
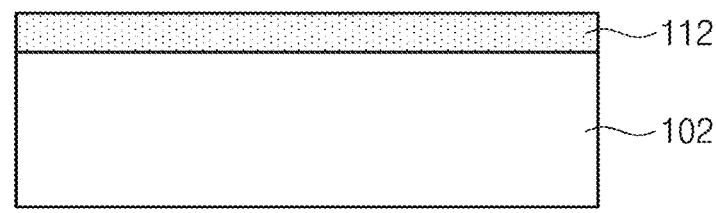

FIGS. 6A and 6B are views illustrating another modified example of a method for manufacturing a graphene structure according to example embodiments of the inventive concepts.

Referring to FIG. 6A, a base graphene layer 110 is formed on a base substrate 100, as described with reference to FIG. 5A. A source 130 may be provided to the base graphene layer 110 formed on the base substrate 100 by the method described with reference to FIG. 4, thereby forming a graphene structure 112 in which the linking material is provided at the defect of the base graphene layer 110.

Referring to FIG. 6B, after the formation of the linking material, the graphene structure 112 may be transferred to another substrate 102. The graphene structure 112 may be transferred to the another substrate 102 by the same method as the method of transferring the base graphene layer 110 described with reference to FIG. 5B.

Test results of characteristics of the graphene structure according to example embodiments of the inventive concepts will be described hereinafter.

Figure 7:
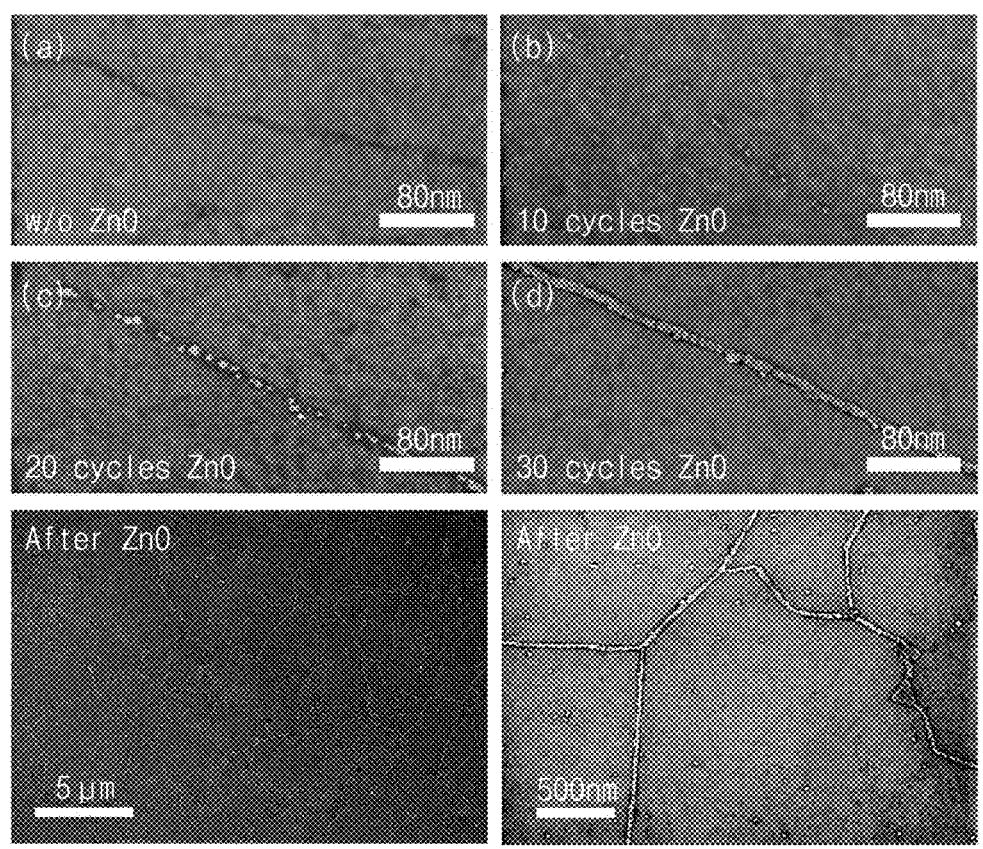
FIG. 7 is a scanning electron microscope (SEM) image showing a graphene structure according to example embodiments of the inventive concepts.

FIG. 7 is a scanning electron microscope (SEM) image showing a graphene structure according to example embodiments of the inventive concepts.

Referring to FIG. 7, a poly-crystalline graphene layer was formed on a copper thin layer by a CVD method. After the formation of the graphene layer, a linking material of ZnO was formed at a defect of the graphene layer by an ALD method using diethylzinc (DEZ) and deionized water ($H_2O$) as sources.

In detail, diethylzinc (DEZ) and deionized water ($H_2O$) were evaporated at 25 degrees Celsius and were provided to the graphene layer. In addition, a unit process was performed 10 times, 20 times, and 30 times to selectively provide ZnO to the defect of the graphene layer. Here, the unit process included exposing the graphene layer to diethylzinc (DEZ) at 250 mTorr or less for 5 seconds, performing a purge process using an argon (Ar) gas for 60 seconds, exposing the graphene layer to $H_2O$ for 5 seconds, and performing a purge process using an Ar gas for 90 seconds. It may be recognized that ZnO is selectively formed at the defect of the graphene layer since the unit processes are performed.

Figure 8:
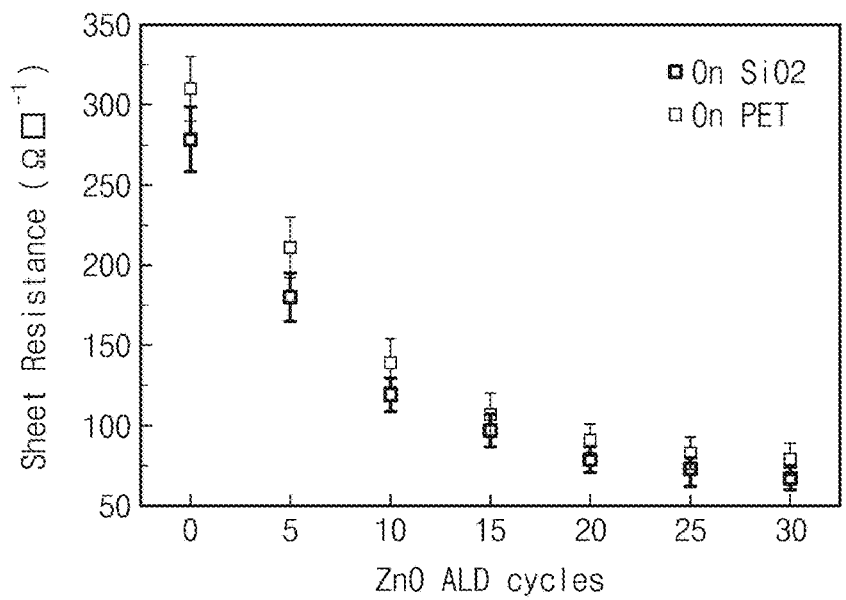
FIG. 8 is a graph illustrating a sheet resistance of a graphene structure against the number of atomic layer deposition (ALD) processes (or ALD cycles), according to example embodiments of the inventive concepts.

FIG. 8 is a graph illustrating a sheet resistance of a graphene structure against the number of atomic layer deposition (ALD) processes (or ALD cycles), according to example embodiments of the inventive concepts.

Referring to FIG. 8, graphene structures according to example embodiments of the inventive concepts were formed on $SiO_2$ and polyethylene terephthalate (PET) by the method described with reference to FIG. 7, and ZnO corresponding to the linking material was formed by the ALD process using DEZ and $H_2O$. A sheet resistance of the graphene structure according to the number of the ALD processes (or ALD cycles) was measured.

As shown in FIG. 8, it may be recognized that the sheet resistance of the graphene structure gradually decreases as the ALD cycle for forming ZnO of the linking material is repeatedly performed. It may be recognized that a decrement of the sheet resistance gradually decreases as the number of the repeated ALD cycles increases. In addition, it may be recognized that the decrement of the sheet resistance becomes substantially 0 (zero) and is saturated when the number of the repeated ALD cycles is 25 or more. In other words, it may be recognized that the sheet resistance is effectively reduced by repeatedly performing the ALD cycle for providing ZnO at the defect of the graphene layer.

Figure 9:
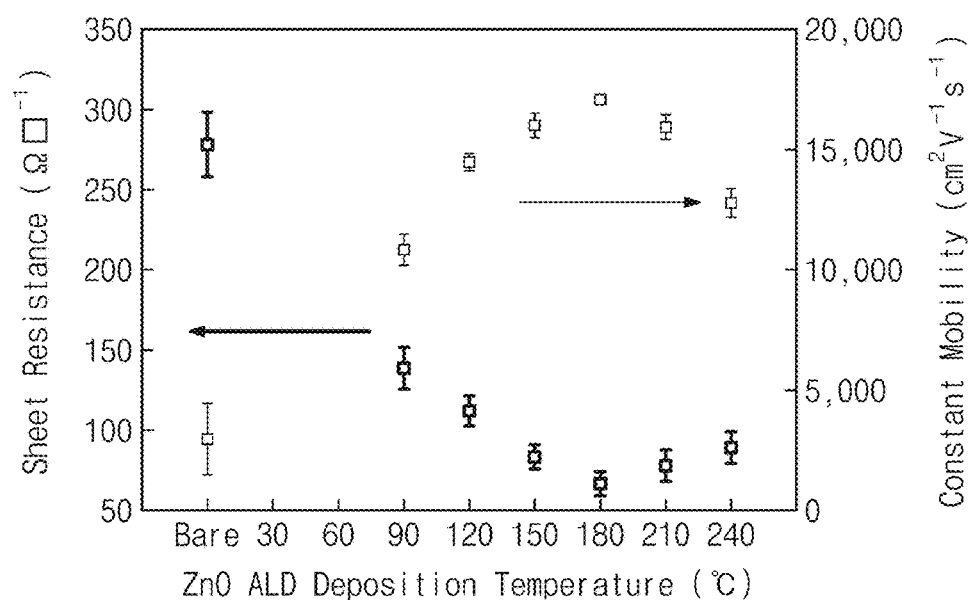
FIG. 9 is a graph illustrating a sheet resistance of a graphene structure against a deposition temperature of an ALD process, according to example embodiments of the inventive concepts.

FIG. 9 is a graph illustrating a sheet resistance of a graphene structure against a deposition temperature of an ALD process, according to example embodiments of the inventive concepts.

Referring to FIG. 9, a graphene structure according to example embodiments of the inventive concepts was formed on a silicon substrate by the method described with reference to FIG. 7, and ZnO of the linking material was formed by the ALD process using DEZ and $H_2O$. A sheet resistance of the graphene structure according to a deposition temperature (or a process temperature) of the ALD process was measured.

As shown in FIG. 9, it may be recognized that a sheet resistance and a mobility of the graphene structure are adjusted according to the deposition temperature of the ALD process for forming ZnO of the linking material. In particular, it may be recognized that the sheet resistance decreases but the mobility increases as the deposition temperature of the ALD process increases under a condition that the deposition temperature does not exceed 180 degrees Celsius. On the other hand, it may be recognized that the sheet resistance increases but the mobility decreases as the deposition temperature of the ALD process increases under a condition that the deposition temperature exceeds 180 degrees Celsius. In other words, the sheet resistance and/or the mobility of the graphene structure may be adjusted by adjusting the temperature of the ALD process. In detail, the ALD process may be performed at the temperature of 180 degrees Celsius or less to effectively reduce the sheet resistance of the graphene structure and to effectively increase the mobility of the graphene structure.

Figure 10:
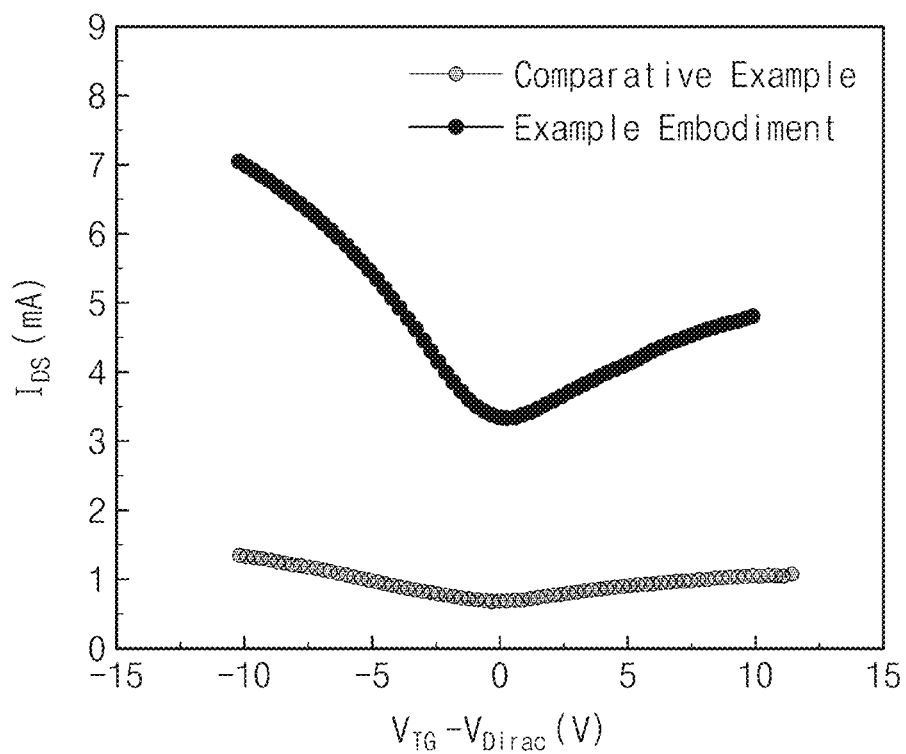
FIG. 10 is a graph illustrating a current-voltage characteristic of a transistor manufactured using a graphene structure according to example embodiments of the inventive concepts.

FIG. 10 is a graph illustrating a current-voltage characteristic of a transistor manufactured using a graphene structure according to example embodiments of the inventive concepts.

Referring to FIG. 10, a transistor according to example embodiments of the inventive concepts was manufactured to have an active layer formed of the graphene structure including ZnO of the linking material, a gate insulating layer formed of $Al_2O_3$, a source formed of gold (Au), a drain formed of Au, and a gate electrode formed of Au. A transistor according to a comparative example was manufactured to have an active layer formed of a poly-crystalline graphene layer manufactured without ZnO of the linking material by a CVD method, a gate insulating layer formed of $Al_2O_3$, a source formed of Au, a drain formed of Au, and a gate electrode formed of Au.

It may be recognized that a current-voltage characteristic of the transistor according to the comparative example is low by a defect such as a grain boundary existing in the graphene layer used as the active layer. On the other hand, it may be recognized that the transistor of the example embodiments, which has the active layer formed of the graphene structure having the linking material (ZnO) provided at the defect of the graphene layer, has a high mobility and an improved current-voltage characteristic as compared with the transistor of the comparative example. In other words, it may be recognized that the graphene structure manufactured by selectively providing the linking material at the defect of the graphene layer according to the inventive concepts is usefully applied to various electronic elements such as the transistor.

Figure 11:
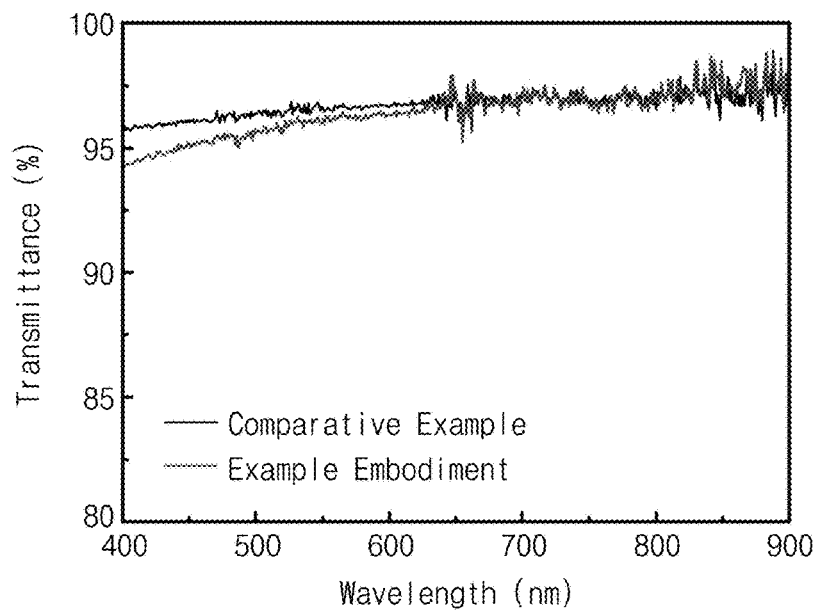
FIG. 11 is a graph illustrating a transmittance of a graphene structure according to example embodiments of the inventive concepts.

FIG. 11 is a graph illustrating a transmittance of a graphene structure according to example embodiments of the inventive concepts.

Referring to FIG. 11, a transmittance of the graphene structure including ZnO of the linking material according to example embodiments of the inventive concepts was measured according to a wavelength, and a transmittance of the graphene layer manufactured without ZnO of the linking material by the CVD method according to the comparative example was measured according to a wavelength. As shown in FIG. 11, it may be recognized that the transmittance according to the wavelength is not greatly changed even though ZnO is selectively provided at the defect of the graphene layer. In other words, it may be recognized that the graphene structure manufactured by selectively providing the linking material at the defect of the graphene layer according to the inventive concepts is usefully applied to a transparent electronic element.

Figure 12:
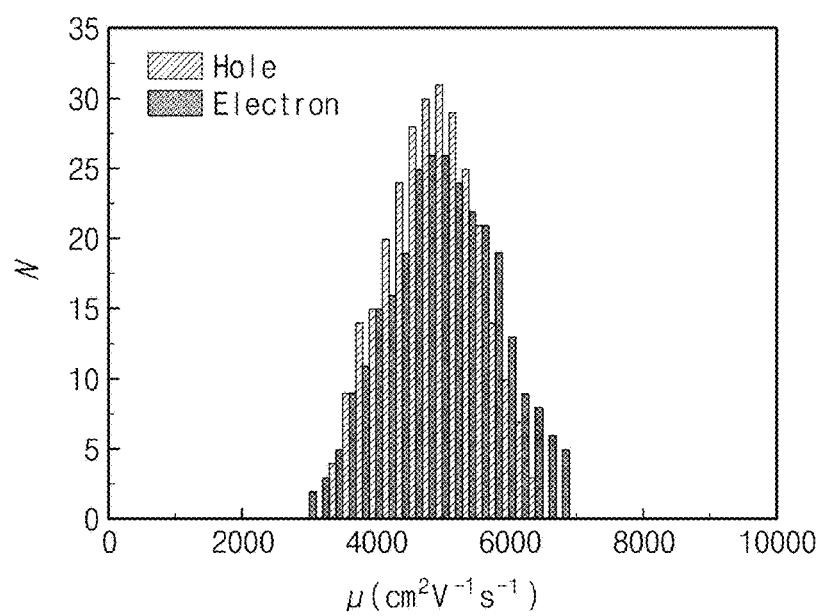
FIG. 12 is a graph illustrating a hole mobility and an electron mobility of a graphene layer according to a comparative example.
Figure 13:
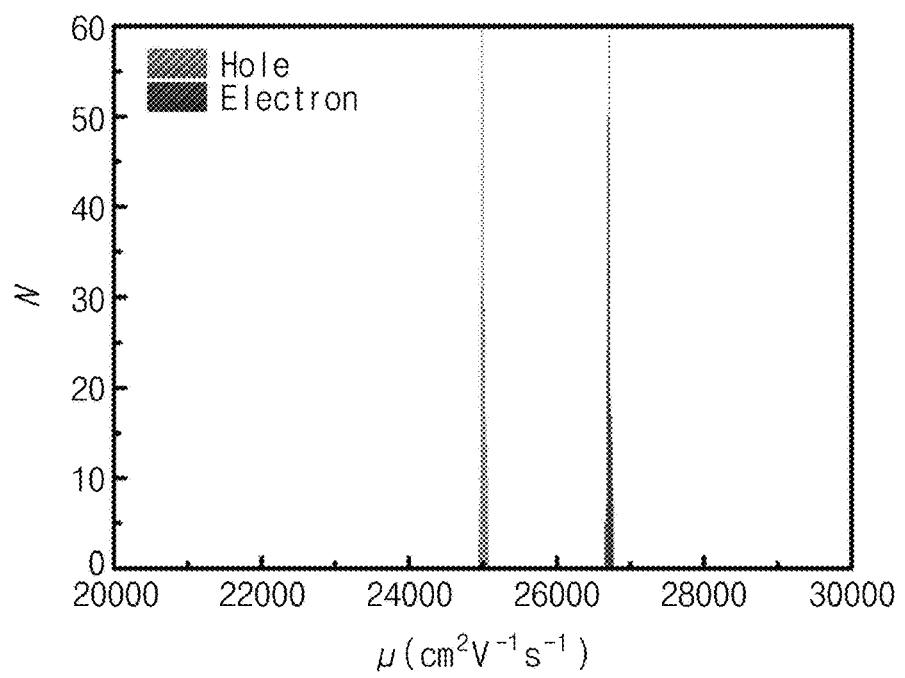
FIG. 13 is a graph illustrating a hole mobility and an electron mobility of a graphene structure according to example embodiments of the inventive concepts.

FIG. 12 is a graph illustrating a hole mobility and an electron mobility of a graphene layer according to a comparative example, and FIG. 13 is a graph illustrating a hole mobility and an electron mobility of a graphene structure according to example embodiments of the inventive concepts.

Referring to FIGS. 12 and 13, it may be recognized that hole and electron mobilities of the graphene layer manufactured without ZnO of the linking material by the CVD method according to the comparative example are widely distributed in a range of about 3,000 $cm^2V^{-1}S^{-1}$ to about 7,000 $cm^2V^{-1}S^{-1}$. On the other hand, it may be recognized that hole and electron mobilities of the graphene structure including ZnO of the linking material according to example embodiments of the inventive concepts have about 25,000 $cm^2V^{-1}S^{-1}$ and about 26,800 $cm^2V^{-1}S^{-1}$, which are much higher than the hole and electron mobilities of the graphene layer according to the comparative example. In addition, it may be recognized that the hole and electron mobilities of the graphene structure according to example embodiments of the inventive concepts are much more homogeneous than the hole and electron mobilities of the graphene layer according to the comparative example. In other words, providing the linking material at the defect of the graphene layer according to example embodiments of the inventive concepts may effectively improve reliability of a device.

Figure 14:
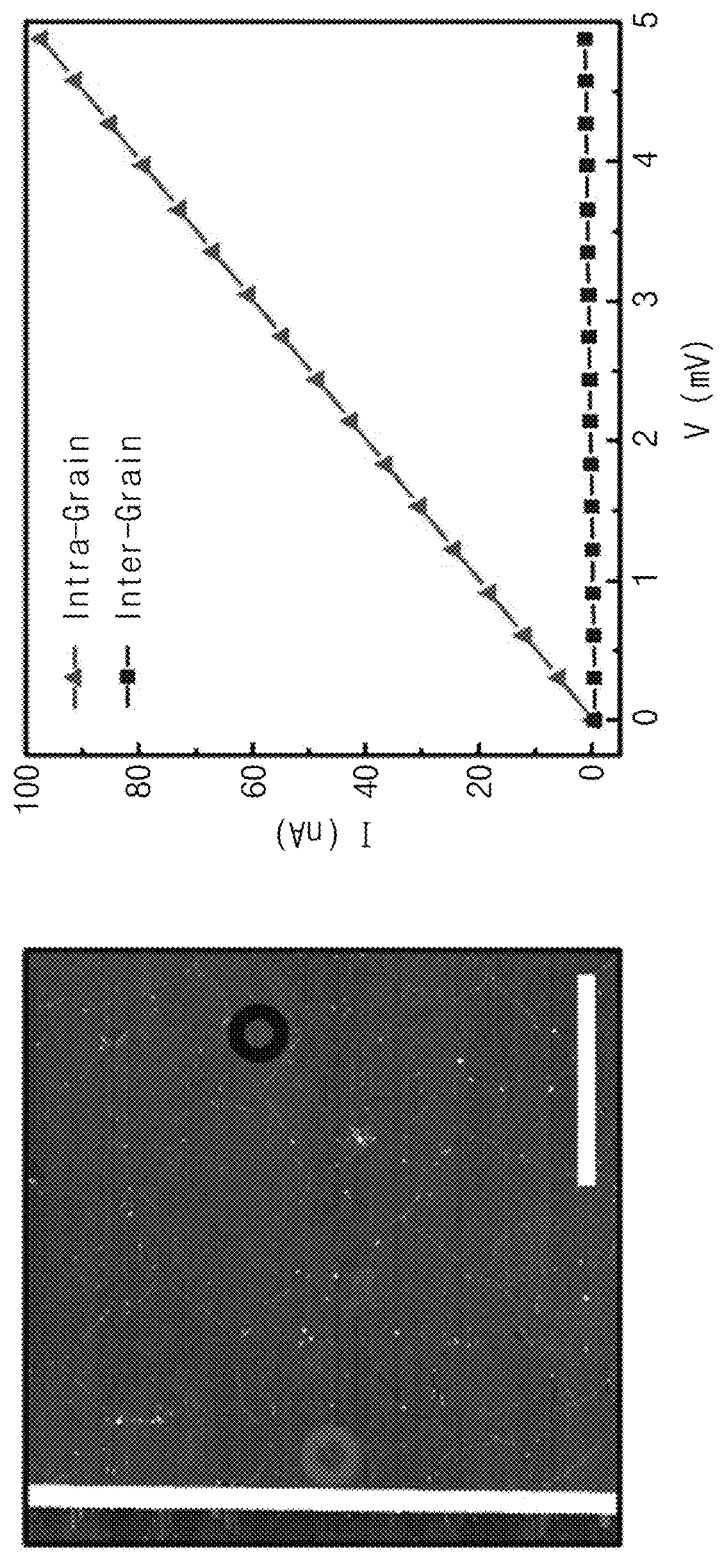
FIG. 14 illustrates a measured resistance of a graphene layer according to a comparative example.
Figure 15:
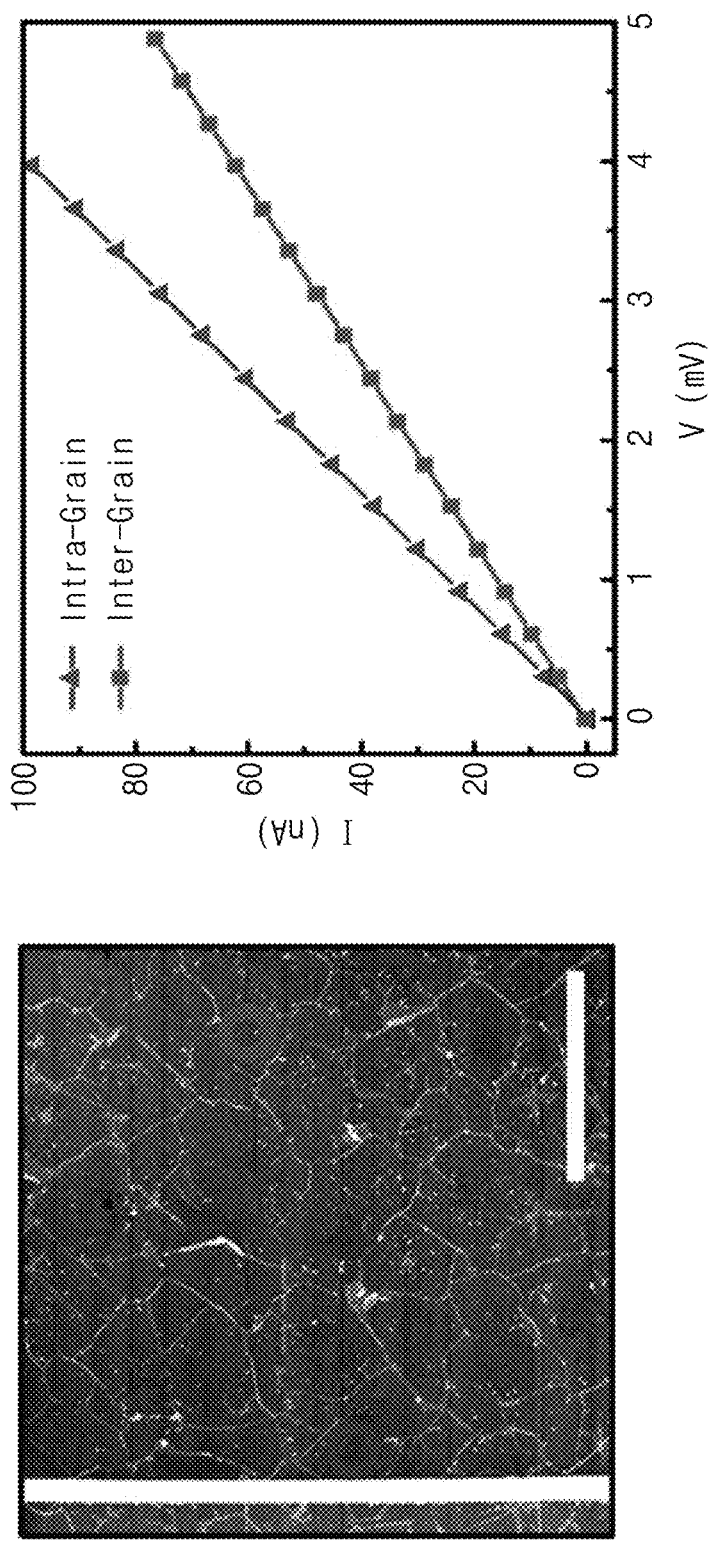
FIG. 15 illustrates a measured resistance of a graphene structure according to example embodiments of the inventive concepts.

FIG. 14 illustrates a measured resistance of a graphene layer according to a comparative example, and FIG. 15 illustrates a measured resistance of a graphene structure according to example embodiments of the inventive concepts.

Referring to FIGS. 14 and 15, in the graphene layer manufactured without ZnO of the linking material by the CVD method according to the comparative example, an intra-grain resistance had a constant value but an inter-grain resistance between different grains had a remarkably high value (e.g., a substantially infinite value) by a grain boundary.

On the other hand, an intra-grain resistance of the graphene structure including ZnO of the linking material according to example embodiments of the inventive concepts was lower than that of the graphene layer according to the comparative example. In particular, an inter-grain resistance between different grains in the graphene structure according to the inventive concepts was higher than the intra-grain resistance of the graphene structure but was much lower than the inter-grain resistance of the graphene layer according to the comparative example. In other words, it may be recognized that the resistance of the grain boundary is markedly reduced by providing the linking material to the grain boundary, according to example embodiments of the inventive concepts.

The graphene structure and the method for manufacturing the same according to examples embodiments of the inventive concepts may be applied to various semiconductor devices (e.g., various thin layer transistors) and various electronic devices.

The graphene structure according to example embodiments of the inventive concepts includes the base graphene layer having the defect, and the linking material provided at the defect of the base graphene layer. Various characteristics (e.g., a high conductivity) of the graphene structure may be improved by the linking material provided at the defect. In other words, it is possible to provide the highly reliable graphene structure which has characteristics improved as compared with those of a poly-crystalline graphene layer.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A graphene structure comprising:
a substrate;
a base graphene layer having a defect on the substrate; and
a linking material selectively provided at the defect of the base graphene layer,
wherein the linking material is combined with carbon of the base graphene layer adjacent to the defect,
wherein the defect of the base graphene comprises a sp3 hybridization type defect covering the substrate and protruding from the substrate, and
the linking material is provided on the sp3 hybridization type defect.

2. The graphene structure of claim 1, wherein the base graphene layer comprises a first graphene grain having a first crystal orientation and a second graphene grain having a second crystal orientation, wherein the linking material is provided at the defect between the first graphene grain and the second graphene grain, and wherein the linking material is combined with carbon of the first graphene grain adjacent to the defect and carbon of the second graphene grain adjacent to the defect so that the linking material connects the carbons of the first and second graphene grains and a sheet resistance of the base graphene layer is decreased as compared to the sheet resistance of a graphene layer without a linking material being selectively provided at the defect of the graphene layer.

3. The graphene structure of claim 1, wherein the defect of the base graphene layer further comprises at least one of a grain boundary, a point defect and a line defect.

4. The graphene structure of claim 1, wherein the base graphene layer is in a poly-crystalline state.

5. The graphene structure of claim 1, wherein carbon of the base graphene layer adjacent to the defect has a dangling bond, and wherein the linking material passivates the dangling bond.

6. The graphene structure of claim 1, wherein the graphene structure comprises:
a first portion formed of the base graphene layer and having a first thickness; and
a second portion formed of the linking material and having a second thickness greater than the first thickness.

7. The graphene structure of claim 1, wherein carbons of the base graphene layer adjacent to the defect are connected to each other by the linking material.

8. The graphene structure of claim 1, wherein the graphene structure has a higher mobility, a higher thermal conductivity, and a lower vapor transmission rate than a poly-crystalline two-dimensional (2D) graphene layer.

9. The graphene structure of claim 1, wherein the graphene structure has a higher hardness than a poly-crystalline two-dimensional (2D) graphene layer.

10. The graphene structure of claim 1, wherein hole and electron mobilities of the graphene structure are more homogeneous than hole and electron mobilities of a poly-crystalline two-dimensional (2D) graphene layer.

11. The graphene structure of claim 1, wherein the base graphene layer includes a plurality of the defects,
wherein a plurality of the linking materials are provided at the plurality of defects, and
wherein the plurality of linking materials are formed of the same material.

12. A method for manufacturing a graphene structure, the method comprising:
preparing a base substrate;
forming a two-dimensional (2D) base graphene layer having a defect on the base substrate; and
providing a linking material to the defect of the base graphene layer by providing a source onto the base graphene layer, the providing the linking material is performed by an atomic layer deposition method at a temperature of 180 ° C. or less, and
wherein a sheet resistance and a mobility of the graphene structure are adjusted according to a process temperature of the atomic layer deposition method.

13. The method of claim 12, wherein the linking material has a hexagonal structure or the linking material is selected from the group consisting of ZnO, Al—ZnO, $Al_2O_3$, $TiO_2$, a $Al_2O_3$—$TiO_2$ nanolaminate, a ZnO—$TiO_2$ nanolaminate, NiS, TiS, $Sb_2S_3$, Zn—HQ, Zn-4MP, Zn—BDT, Al—HQ, Al-4MP, Al—BDT, Ti—HQ, Ti-4MP and Ti—BDT.

14. The method of claim 12, wherein the providing of the source onto the base graphene layer is performed a plurality of times, and
wherein a resistance of the graphene structure is adjusted according to the number of times of the providing of the source onto the base graphene layer.

15. The method of claim 12, wherein the linking material is selectively provided to the defect of the base graphene layer.

16. The method of claim 12, further comprising:
transferring the base graphene layer onto another substrate before the providing of the source onto the base graphene layer.

17. The method of claim 12, further comprising:
transferring the base graphene layer and the linking material onto another substrate after the providing of the linking material to the defect of the base graphene layer.

18. A graphene structure comprising:
a substrate;
a base graphene layer having a defect on the substrate; and
a linking material provided at the defect of the base graphene layer, wherein the base graphene layer comprises a first graphene grain having a first crystal orientation and a second graphene grain having a second crystal orientation,
wherein the linking material is provided at the defect between the first graphene grain and the second graphene grain,
wherein the linking material is combined with carbon of the first graphene grain adjacent to the defect and carbon of the second graphene grain adjacent to the defect so that the linking material connects the carbons of the first and second graphene grains and a sheet resistance of the base graphene layer is decreased as compared to the sheet resistance of a graphene layer without a linking material being selectively provided at the defect of the graphene layer,
wherein the defect of the base graphene comprises a sp3 hybridization type defect covering the substrate and protruding from the substrate, and
the linking material is provided on the sp3 hybridization type defect.

* * * * *